US011947453B2

(12) United States Patent
Eilert et al.

(10) Patent No.: US 11,947,453 B2
(45) Date of Patent: Apr. 2, 2024

(54) MEMORY DEVICE WITH ON-DIE CACHE

(71) Applicant: Micron Technology, Inc., Boise, ID (US)

(72) Inventors: Sean S. Eilert, Penryn, CA (US); Ameen D. Akel, Rancho Cordova, CA (US); Shivam Swami, Folsom, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 250 days.

(21) Appl. No.: 17/100,453

(22) Filed: Nov. 20, 2020

(65) Prior Publication Data

US 2022/0121570 A1 Apr. 21, 2022

Related U.S. Application Data

(60) Provisional application No. 63/093,412, filed on Oct. 19, 2020.

(51) Int. Cl.
*G06F 12/0802* (2016.01)
*G06F 3/06* (2006.01)

(52) U.S. Cl.
CPC ........ *G06F 12/0802* (2013.01); *G06F 3/0604* (2013.01); *G06F 3/0659* (2013.01); *G06F 3/0679* (2013.01); *G06F 2212/22* (2013.01); *G06F 2212/221* (2013.01)

(58) Field of Classification Search
CPC .. G06F 12/0802; G06F 3/0604; G06F 3/0659; G06F 3/0679; G06F 2212/22; G06F 2212/221
See application file for complete search history.

(56) References Cited

U.S. PATENT DOCUMENTS

| | | | |
|---|---|---|---|
| 2003/0135693 A1* | 7/2003 | David | G06F 12/0893 711/3 |
| 2009/0133023 A1* | 5/2009 | Li | G06F 9/546 718/102 |
| 2013/0290607 A1 | 10/2013 | Chang | |
| 2013/0336079 A1 | 12/2013 | Kim et al. | |
| 2014/0208156 A1 | 7/2014 | Muralimanohar et al. | |
| 2015/0332743 A1 | 11/2015 | Kim | |

(Continued)

OTHER PUBLICATIONS

U.S. Appl. No. 17/073,621, filed Oct. 19, 2020.

(Continued)

*Primary Examiner* — Baboucarr Faal
(74) *Attorney, Agent, or Firm* — LOWENSTEIN SANDLER LLP

(57) ABSTRACT

An example memory sub-system includes: a plurality of bank groups, wherein each bank group comprises a plurality of memory banks; a plurality of row buffers, wherein two or more row buffers of the plurality of row buffers are associated with each memory bank; a cache comprising a plurality of cache lines; a processing logic communicatively coupled to the plurality of bank groups and the plurality of row buffers, the processing logic to perform operations comprising: receiving an activate command specifying a row of a memory bank of the plurality of memory banks; fetching data from the specified row to a row buffer of the plurality of row buffers; and copying the data to a cache line of the plurality of cache lines.

20 Claims, 9 Drawing Sheets

(56) References Cited

U.S. PATENT DOCUMENTS

| | | | |
|---|---|---|---|
| 2016/0034406 A1 | 2/2016 | Hansson et al. | |
| 2016/0314042 A1 | 10/2016 | Plants | |
| 2018/0301188 A1 | 10/2018 | Choi et al. | |
| 2018/0314635 A1* | 11/2018 | Alam | G11C 29/52 |
| 2019/0286566 A1* | 9/2019 | Lee | G11C 8/12 |
| 2019/0317895 A1 | 10/2019 | Jung et al. | |
| 2019/0377634 A1 | 12/2019 | Jung | |

OTHER PUBLICATIONS

USPTO, Office Action for U.S. Appl. No. 17/073,621, dated Jul. 2, 2021.
USPTO, Final Office Action for U.S. Appl. No. 17/073,621, dated Nov. 30, 2021.
USPTO, Final Office Action for U.S. Appl. No. 17/073,621, dated Feb. 8, 2022.
USPTO, Office Action for U.S. Appl. No. 17/073,621, dated May 31, 2022.
Jacob, Bruce, "DRAM Systems Research", 5 pages, [retrieved from Internet: Aug. 2, 2021].
"DDR4 SDRAM—Understanding the Basics", https://www.systemverilog.io/ddr4-basics, 15 pages, [retrieved from Internet: Aug. 2, 2021].
USPTO, Notice of Allowance for U.S. Appl. No. 17/073,621, dated Aug. 24, 2022.
USPTO, Notice of Allowance for U.S. Appl. No. 17/073,621, dated Dec. 14, 2022.

\* cited by examiner

MEMORY DEVICE WITH ON-DIE CACHE

REFERENCE TO RELATED APPLICATION

This application claims the benefit of U.S. Provisional Patent Application No. 63/093,412, filed Oct. 19, 2020, the entirety of which is incorporated herein by reference.

TECHNICAL FIELD

Embodiments of the present disclosure are generally related to memory systems, and more specifically, are related to implementing memory devices (e.g., dynamic random access memory (DRAM) devices) with on-die cache.

BACKGROUND

A DRAM device includes multiple memory banks grouped in bank groups, e.g., sixteen memory banks grouped into four bank groups. Each memory bank is a memory array that includes a plurality of memory cells, such that each memory cell is capable of storing, depending on the memory cell type, one or more bits of information.

BRIEF DESCRIPTION OF THE DRAWINGS

The present disclosure will be understood more fully from the detailed description given below and from the accompanying drawings of some embodiments of the present disclosure.

DETAILED DESCRIPTION

Figure 1A:
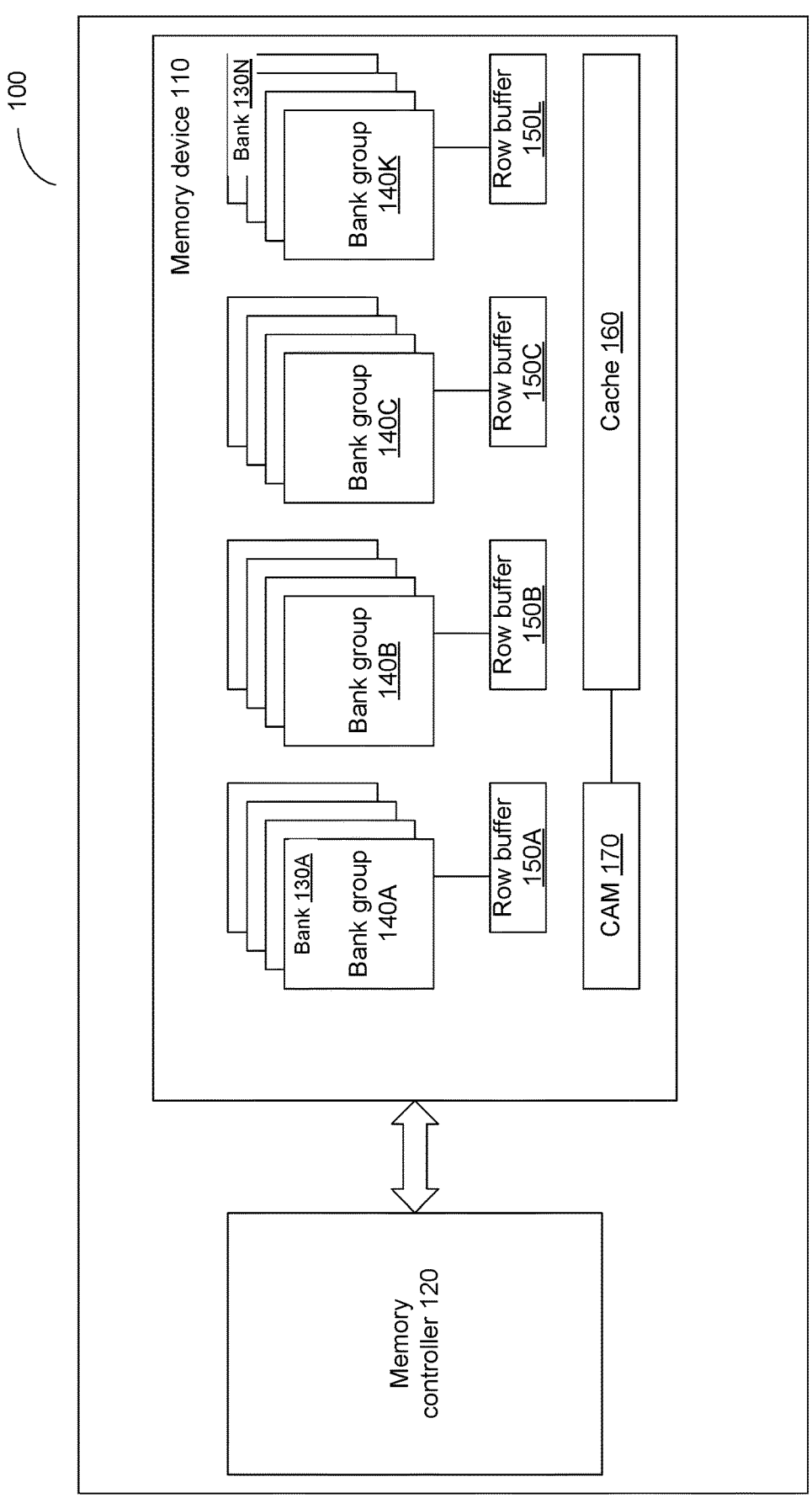
FIGS. 1A-1B schematically illustrate a high-level component diagram of an example memory sub-system implemented in accordance with aspects of the present disclosure.

Embodiments of the present disclosure are directed to implementing memory devices, such as dynamic random access memory (DRAM) devices, with on-die cache.

A DRAM device includes multiple memory banks grouped in bank groups, e.g., sixteen memory banks grouped into four bank groups. Each memory bank is a memory array that includes a plurality of memory cells, such that each memory cell is capable of storing, depending on the memory cell type, one or more bits of information. A memory cell includes a capacitor that holds an electric charge and a transistor that acts as a switch controlling access to the capacitor. Accordingly, the memory cell may be programmed (written to) by applying a certain voltage, which results in an electric charge being held by the capacitor. The memory cells are joined by wordlines, which are conducting lines electrically connected to the control gates of the memory cells, and bitlines, which are conducting lines electrically connected to the drain electrodes of the memory cells.

A memory access operation may begin with the ACT (Activate) command, which selects the memory bank and the row and copies the data from memory cells of the selected row to a row buffer for subsequent accesses. The RD (Read) command, which may be issued after the Activate command, specifies the starting column (bitline) location for the read operation and causes the data to be moved from the specified column location of the row buffer to the memory controller. The WR (Write) command, which may be issued after the Activate command, specifies the starting column (bitline) location for the write operation and causes the data supplied by the memory controller to be stored at the specified column location of the row buffer.

The selected row remains active (open) for accesses until the PRE (Precharge) command is issued to that bank, which closes the open row by moving the data from the row buffer to the memory cells of the open row. Alternatively, instead of issuing an explicit Precharge command to deactivate a certain bank, the RDA (Read with Auto-Precharge) and WRA (Write with Auto-Precharge) commands may be used to automatically precharge the row once the read or write operation is complete. Once a bank has been precharged, it is in the idle state and should be activated prior to any Read or Write commands being issued to that bank.

Thus, a row buffer effectively caches the data from the selected row. However, the efficiency of the caching scheme is effectively limited by the cache size, which in the above-described scenario is a single row buffer per bank. The systems and methods of the present disclosure improves the memory access and overcome the above-noted and other deficiencies of various memory device implementations by providing a dedicated on-die low latency memory for caching the data from the main memory (e.g., from the DRAM memory banks). In some implementations, the on-die low latency memory to be utilized as the cache may be provided by static random access (SRAM) memory, the access latency of which is less than the access latency of DRAM by at least an order of magnitude.

While the example implementations described herein utilize DRAM as the main memory and SRAM as the cache, the systems and methods of the present disclosure are not tied to or limited by any particular memory technologies. Therefore, advantages of the systems and methods implemented in accordance with some embodiments of the present disclosure include, but are not limited to, improving the memory access efficiency by providing a low latency on-die cache to be utilized for caching the data from the memory banks of the main memory.

Figure 1B:
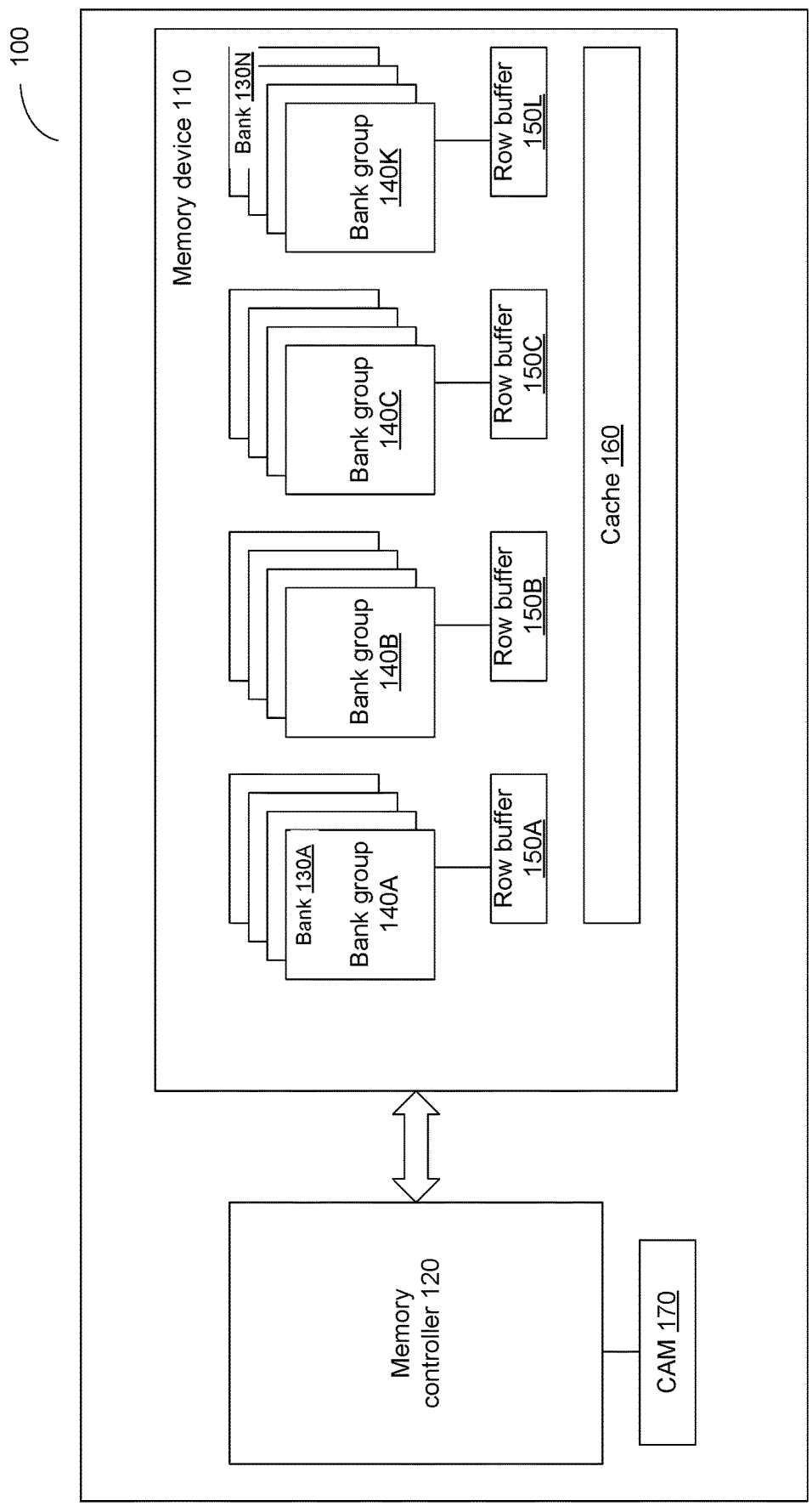

FIGS. 1A-1B schematically illustrate high-level component diagrams of example memory sub-systems implemented in accordance with aspects of the present disclosure.

As shown in FIGS. 1A-1B, the memory sub-system 100 includes one or more memory devices 110 coupled to the memory controller 120, which may communicate to a host computer system (not shown in FIGS. 1A-1B). Memory controller 120 and/or various other functional components of the memory sub-system 100 implement processing logic for performing the memory access operations described herein below. "Coupled to" herein refers to electrical connections between components, including indirect connections via one or more intervening components and direct connections (i.e., without intervening components).

The memory device (e.g., DRAM device) 110 includes multiple memory banks 130A-130N, which are grouped in bank groups 140A-140K. While FIGS. 1A-1B illustrate sixteen memory banks grouped into four bank groups, various other implementations may employ other numbers of bank groups and banks. Each memory bank 130 is a memory array that includes a plurality of memory cells, such that each memory cell is capable of storing, depending on the memory cell type, one or more bits of information.

As noted herein above, the memory device 110 may further include a set of row buffers 150A-150L, which may be utilized for storing the data retrieved from a row of a bank 130. In an illustrative example, one or more row buffers 150 may be dedicated to each memory bank 130. In another illustrative example, one or more row buffers 150 may be shared between several collocated memory banks 130 (e.g., between the banks of a single bank group 140). In another illustrative example, one or more row buffers 150 may be shared between all memory banks 130 of the memory device 110.

The memory device may further include an on-die cache 160, which may be utilized for caching portions of the data stored in the main memory banks 130A-130N. In an illustrative example, the data that has been read from a memory bank into a row buffer may be also cached by the on-die cache 160, which thus may be utilized for servicing subsequent memory access requests that are directed to the same row. In some implementations, the cache line size of the on-die cache 160 may match the row buffer size, thus simplifying the cache line allocation schemes that may be employed for managing the cache 160.

Various other components, such as sense amplifiers, input/output interfaces, and command interfaces are omitted from FIGS. 1A-1B for clarity and conciseness. In one embodiment, the memory device 110 may be implemented as one or more integrated circuits located on one or more dies. In another embodiment, the memory sub-system 100 may be implemented as a System-on-Chip, which, in addition to the memory device 110 and memory controller 120 of FIGS. 1A-1B, may include one or more processing cores and one or more input/output (I/O) interfaces.

In some implementations, management of the cache 160 may be performed by circuitry that is disposed on the memory device 110. In an illustrative example, allocation of cache lines of the cache 160 for storing the data that is read from memory banks may be managed by an on-die content-addressable memory (CAM) circuit 170, as schematically illustrated by FIG. 1A. The CAM circuit 170 may decode the memory address specified by the memory access request into a reference to a line of the cache 160 if the requested data has been previously cached or to a reference to a memory bank and a row within the memory bank where the requested data is stored, thus not requiring any changes to the memory interface.

Alternatively, management of the cache 160 may be performed by circuitry that is disposed outside of the memory device 110. In an illustrative example, the CAM circuit 170 employed for the memory address translation may be located on the system-on-chip implementing the memory sub-system 100, as schematically illustrated by FIG. 1B. Similarly to the implementation of FIG. 1A, the CAM circuit 170 may decode the memory address specified by the memory access request into a reference to a line of the cache 160 if the requested data has been previously cached or to a reference to a memory bank and a row within the memory bank where the requested data is stored.

The cache management policy implemented by the memory device 110, by the system-on-chip 100, or by the host (not shown in FIGS. 1A-1B) may include caching rules specifying what data should be cached and eviction rules specifying which cache line should be evicted when no cache lines are available to store new data. In some implementations, the baseline caching rule may specify caching any new incoming data. Furthermore, one or more caching rules may implement certain heuristics with respect to which data should be cached (or excluded from caching). Such heuristic rules may specify logical conditions evaluating the data patterns, address ranges, etc. In an illustrative example, a caching rule may specify one or more memory address ranges which should be cached. In another illustrative example, a caching rule may specify one or more memory address ranges which should be excluded from caching. In yet another illustrative example, a caching rule may specify a data pattern such that the incoming data that matches the pattern should be cached. In yet another illustrative example, a caching rule may specify a data pattern such that the incoming data that matches the pattern should be excluded from caching.

The cache management policy may further include one or more eviction rules. In various illustrative examples, an eviction rule may specify the cache line that should be evicted when no cache lines are available to store the new data (e.g., first in first out (FIFO), last in first out (LIFO), least recently used, least frequently used, random replacement, etc.). In some implementations, cache eviction rules may specify logical conditions evaluating the data patterns, address ranges, etc.

As noted herein above, each line of the cache may be associated with cache line metadata specifying the memory address (e.g., the bank group identifier, the memory bank identifier, and the row address), the content of which is currently stored in the cache line. In some implementations, the cache line metadata associated with each line of the cache may further include a line status flag indicating whether the cache line has been modified since it was copied from the main memory. Accordingly, the data stored in the cache line may only be written back to the main memory if the line status flag indicates that the cache line has been modified since it was copied from the main memory. Conversely, unmodified data in the cache line may be discarded upon the cache line eviction.

In the example implementation of FIG. 1B and other implementations in which the cache 160 is managed by circuitry that is disposed outside of the memory device 110, the memory interface may be enhanced to facilitate the signaling indicating the location of the requisite data in the main memory or in the cache.

In some implementations, a flat address space may be implemented by the memory device 110 for both main memory banks 130 and cache 160. Accordingly, an address bit (e.g., the least significant bit, the most significant bit, or any other bit having a specified position within the address) may be chosen to act as a selector between the main memory banks 130 and the cache 160, such that each of the two possible values of the chosen address bit may select either the main memory banks 130 or the cache 160.

Alternatively, the signaling indicating the location of the requisite data in the main memory or in the cache may be performed by re-purposing certain command bits, such that a bit having a specified position within the command would act as a selector between the main memory banks 130 and the cache 160. In various illustrative examples, Activate, Read, Write and/or Precharge commands may be implemented accordingly.

Figure 2:
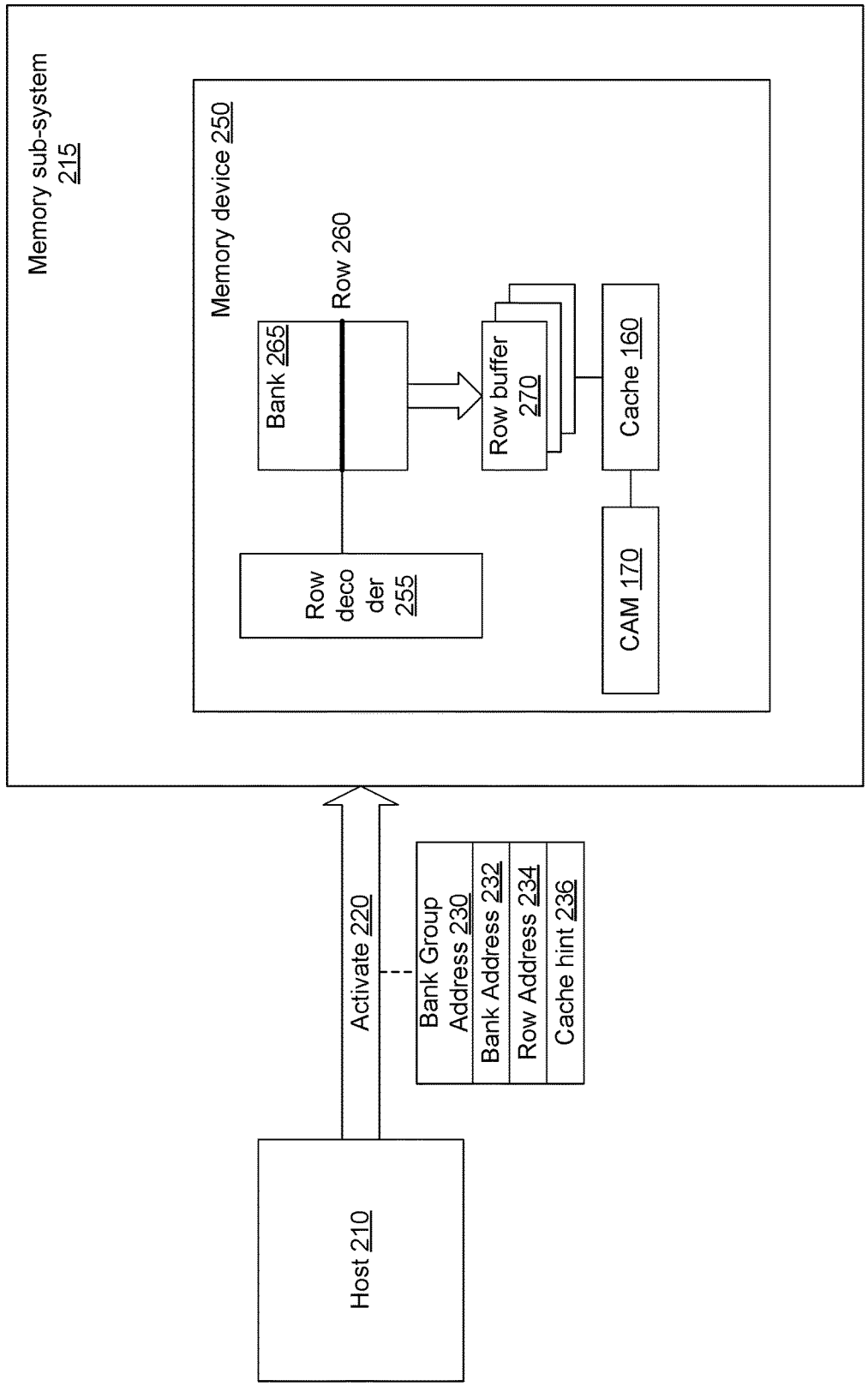
FIG. 2 schematically illustrates interactions of the host and memory sub-system executing the ACT (Activate) command enhanced by the cache hint, in accordance with aspects of the present disclosure.

In some implementations, the memory interface may be enhanced by implementing certain cache-related hints in several commands, thus allowing the host to instruct the memory device to cache or evict certain data. In an illustrative example, the Activate (ACT) command may be enhanced to include a cache hint instructing the memory device to cache or exclude from caching the content of the activated wordline, as schematically illustrated by FIG. 2. In an illustrative example, the baseline caching policy implemented by the memory device may involve caching all data retrieved from the main memory, unless the "exclude from caching" hint is supplied by the Activate (ACT) command. In another illustrative example, the baseline caching policy implemented by the memory device may only involve caching the data retrieved from the main memory if the "cache this" hint is supplied by the Activate (ACT) command.

In some implementations, the memory interface may be enhanced by implementing commands and/or hints specifying caching or exclusion ranges, thus allowing the host to instruct the memory device to cache or exclude from caching certain address ranges.

FIG. 2 schematically illustrates interactions of the host 210 and memory sub-system 215 executing the ACT (Activate) command enhanced by the cache hint, in accordance with aspects of the present disclosure. As noted herein above, the Activate command copies the data from memory cells of the selected row to a specified row buffer for subsequent accesses by Read or Write commands. In an illustrative example, the host 210 may initiate a memory access operation by issuing an ACT (Activate) command 220. Parameters of the Activate command 220 may include the bank group address 230, the bank address 232, the row address 234, and the cache hint 236. Each of the parameters may be encoded by a group of bits transmitted via corresponding inputs of the memory device 250.

Processing the Activate command 220 may involve decoding the physical address fields 230, 232, and 234 by the row decoder 255 and moving the data from the selected row 260 (identified by the row address 234) of bank 265 (identified by the bank address 232) of the bank group identified by the bank group address 230 to the row buffer 270, as well as caching the data read from the row 260, in accordance with the base line caching policy and the value of the cache hint 236. In an illustrative example, if the baseline caching policy implemented by the memory device involves caching all data retrieved from the main memory, processing the Activate command 220 would involve storing the data that has been read from the row 260 to an available line of the cache 160, unless the "exclude from caching" hint is supplied by the Activate (ACT) command 220. Conversely, if the baseline caching policy implemented by the memory device only involves selective caching of the data retrieved from the main memory, processing the Activate command 220 would involve storing the data read from the selected row 260 to an available line of the cache 160 if the "cache this" hint is supplied by the Activate (ACT) command 220. The cache metadata for the cache line is then modified accordingly to associate the cache line with the address in the main memory specified by the Activate command 220. The cached data can be utilized for servicing subsequent memory access requests (read or write commands).

Figure 3:
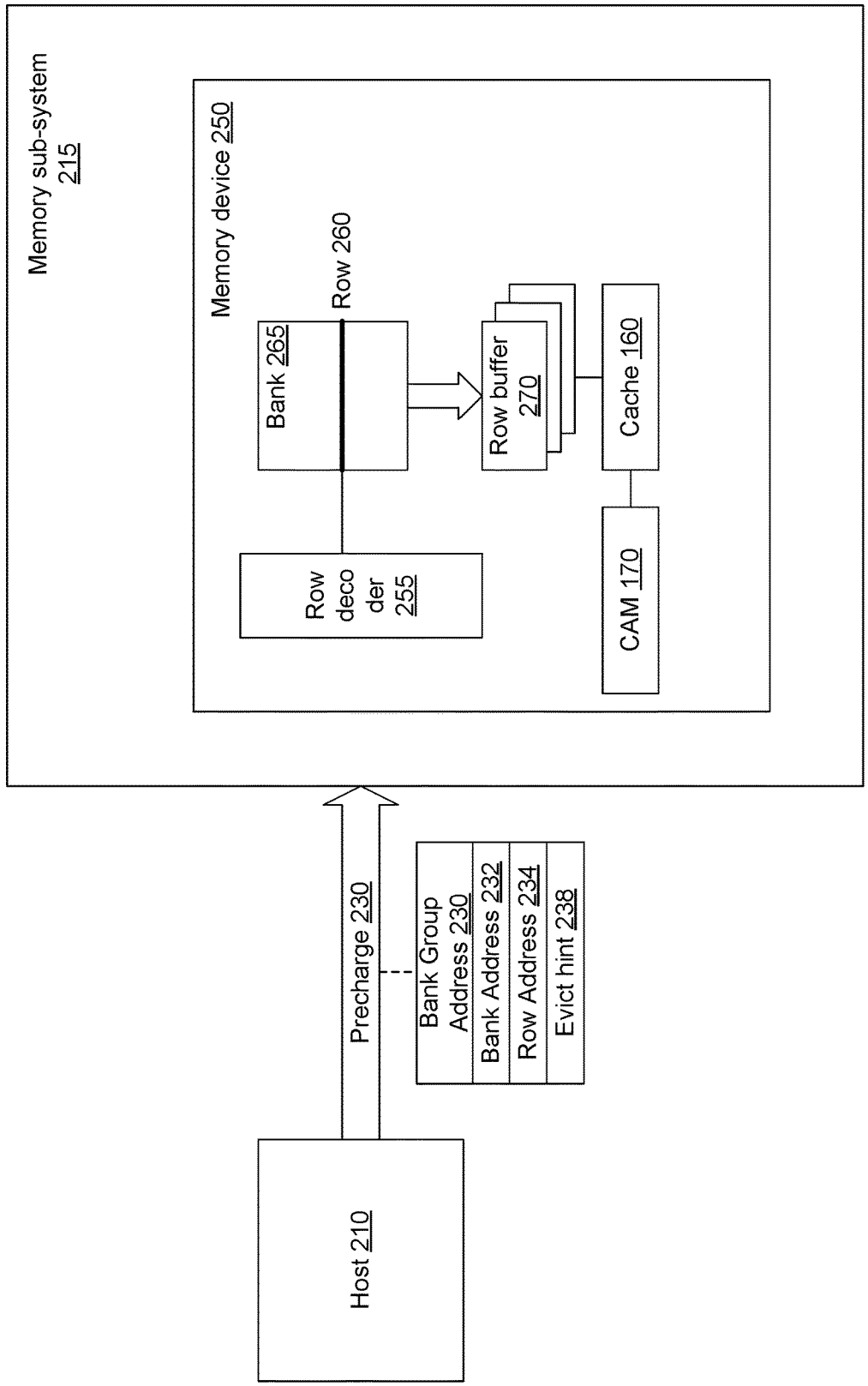
FIG. 3 schematically illustrates interactions of the host and memory sub-system executing the PRE (Precharge) command enhanced by the cache hint, in accordance with aspects of the present disclosure.

In some implementations, the Precharge command may be enhanced to include an evict hint instructing the memory device to evict the cache line storing the content of the wordline being precharged, as schematically illustrated by FIG. 3, which schematically illustrates interactions of the host 210 and memory sub-system 215 executing the PRE (Precharge) command enhanced by the evict hint, in accordance with aspects of the present disclosure. As noted herein above, the host 210 may cause the contents of a specified row buffer to be written to the memory device 250 by issuing the PRE (Precharge) command 230. Accordingly, parameters of the Precharge command 230 may include the bank group address 230, the bank address 232, the row address 234, and the evict hint 238. Each of the parameters may be encoded by a group of bits transmitted via corresponding inputs of the memory device 250.

Processing the Precharge command 230 may involve identifying the cache line associated with the row identified by the bank group address 230, the bank address 232, and the row address 234. The data from the identified cache line may then be copied into the row buffer 270 associated with the row identified by the bank group address 230, the bank address 232, and the row address 234 and/or to the wordline identified by the bank group address 230, the bank address 232, and the row address 234. If the evict hint 238 is set, the cache line may be evicted, and the cache metadata may be modified accordingly.

Figure 4:
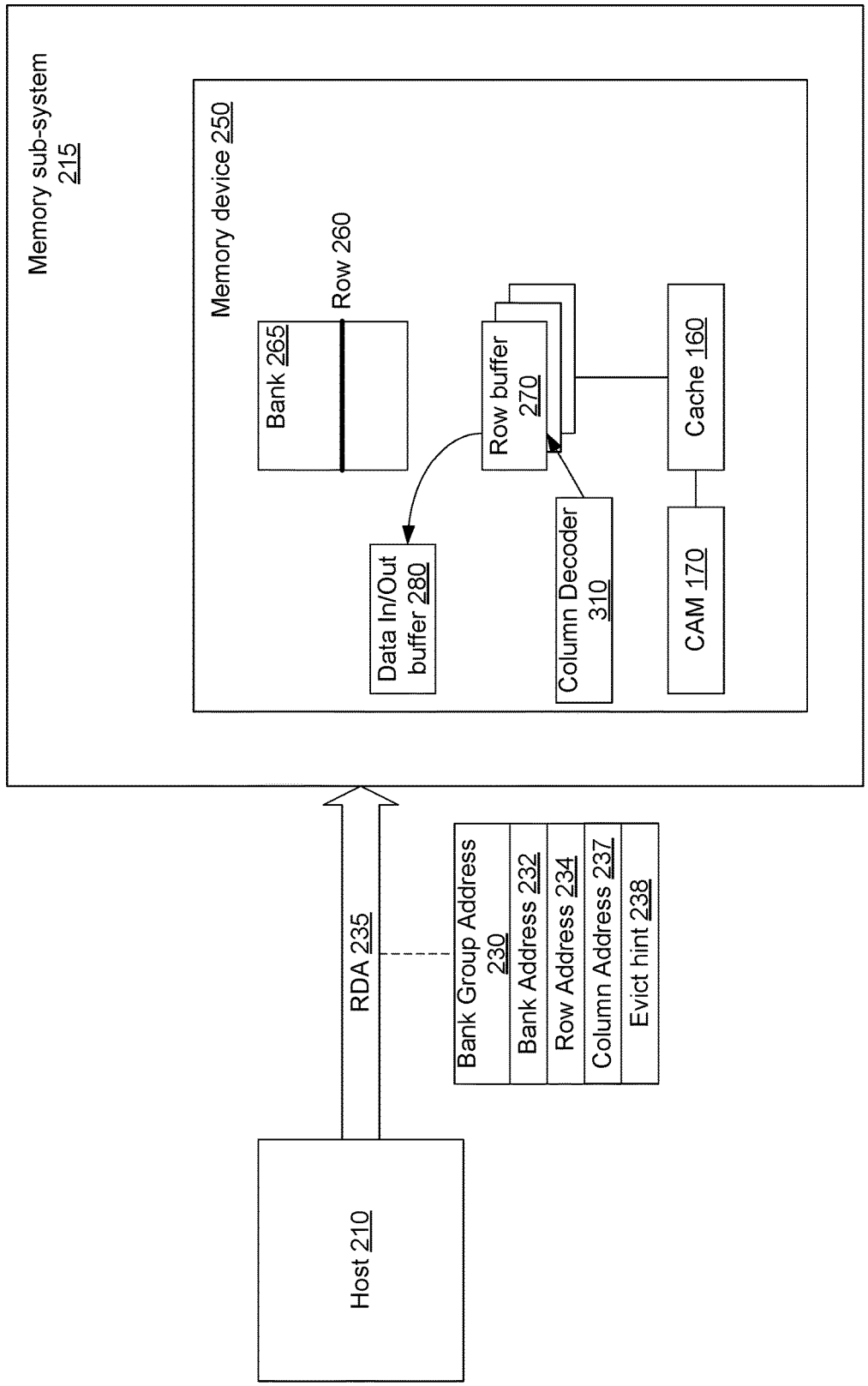
FIG. 4 schematically illustrates interactions of the host and memory sub-system executing the RDA (Read with Auto-Precharge) command enhanced by the cache hint, in accordance with aspects of the present disclosure.
Figure 5:
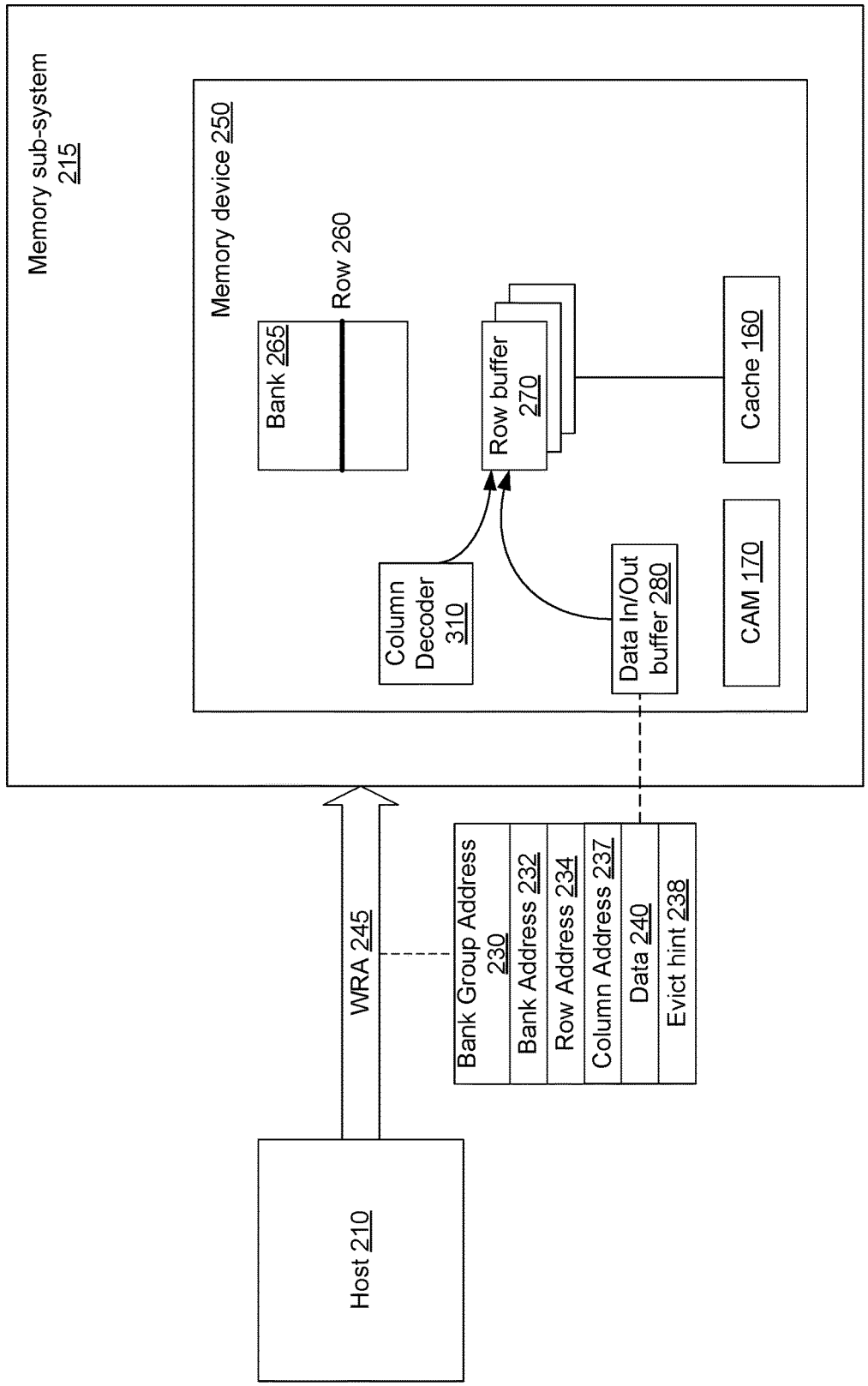
FIG. 5 schematically illustrates interactions of the host and memory sub-system executing the WRA (Write with Auto-Precharge) command enhanced by the cache hint, in accordance with aspects of the present disclosure.

Alternatively, the auto-Precharge mode RDA (Read with Auto-Precharge) and WRA (Write with Auto-Precharge) commands may be enhanced to include an "evict this" hint instructing the memory device to evict the cache line storing the content of the wordline being read from or written to, respectively, as schematically illustrated by FIGS. 4-5.

In particular, FIG. 4 schematically illustrates interactions of the host 210 and memory sub-system 215 executing a RDA (Read with Auto-Precharge) command enhanced by an evict hint, in accordance with aspects of the present disclosure. In an illustrative example, upon completing the Activate command 220, the host 210 may perform a memory access operation by issuing a RDA (Read with Auto-Precharge) command 235. Parameters of the RDA (Read with Auto-Precharge) command 235 may include the bank group address 230, the bank address 232, the row address 234, the column address 237, and the evict hint 238. Each of the parameters may be encoded by a group of bits transmitted via corresponding inputs of the memory device 250.

Processing the RDA (Read with Auto-Precharge) command 235 may involve identifying the cache line associated with the specified memory address and, responsive to detecting a cache miss, identifying the row buffer 270 associated with the specified memory address. The data from the identified cache line or row buffer, starting at the bitline identified by the column address 238, is then copied to the data in/out buffer 280, from which the data will be transferred to the memory controller. If the evict hint 238 is set, the cache line may be evicted, and the cache metadata may be modified accordingly.

FIG. 5 schematically illustrates interactions of the host 210 and memory sub-system 215 executing a WRA (Write with Auto-Precharge) command, in which the row buffer assignment is managed by the memory sub-system 215, in accordance with aspects of the present disclosure. In an illustrative example, upon completing the Activate command 221, the host 210 may perform a memory access operation by issuing a WRA (Write with Auto-Precharge) command 245.

Parameters of the WRA (Write with Auto-Precharge) command 245 may include the bank group address 230, the bank address 232, the row address 234, the column address 237, the data 240 to be written to the specified location of the memory device 250, and the evict hint 238. Each of the parameters may be encoded by a group of bits transmitted via corresponding inputs of the memory device 250.

Processing the WRA (Write with Auto-Precharge) command 245 may involve identifying the cache line associated with the specified memory address and, responsive to detecting a cache miss, identifying the row buffer 270 associated with the specified memory address. The data item 240 supplied by the WRA (Write with Auto-Precharge) command 245 is then copied to the identified cache line or the row buffer 270, starting at the bitline identified by the column address 238. The contents of the cache line or the row buffer 270 is then copied to the wordline identified by the bank group address 230, the bank address 232, and the row address 234. If the evict hint 238 is set, the cache line is evicted, and the cache metadata is modified accordingly.

In some implementations, the memory interface may be enhanced to implement explicit "store in a cache line" and "evict a cache line" commands. The "store in a cache line" command may explicitly instruct the memory device to copy data from a specified location of the main memory to the specified cache line; conversely, the "evict a cache line" command may instruct the memory device to copy data from the specified line of the cache to a specified location of the main memory.

In various implementations of the present disclosure, servicing a memory access request from the cache 160 (i.e., if a cache hit occurs) may exhibit the access latency that is significantly less (e.g., by an order of magnitude) than the access latency of servicing the memory access request from a main memory bank 130 responsive to detecting a cache miss. Accordingly, memory sub-system implementations in which the host is unaware of the underlying cache architecture, may further enhance the memory interface to provide the differentiated latency signaling to the host (e.g., by driving a certain signal of the interface bus to a known state thus notifying the host of the high or low latency involved in servicing the current memory access request).

Figure 6:
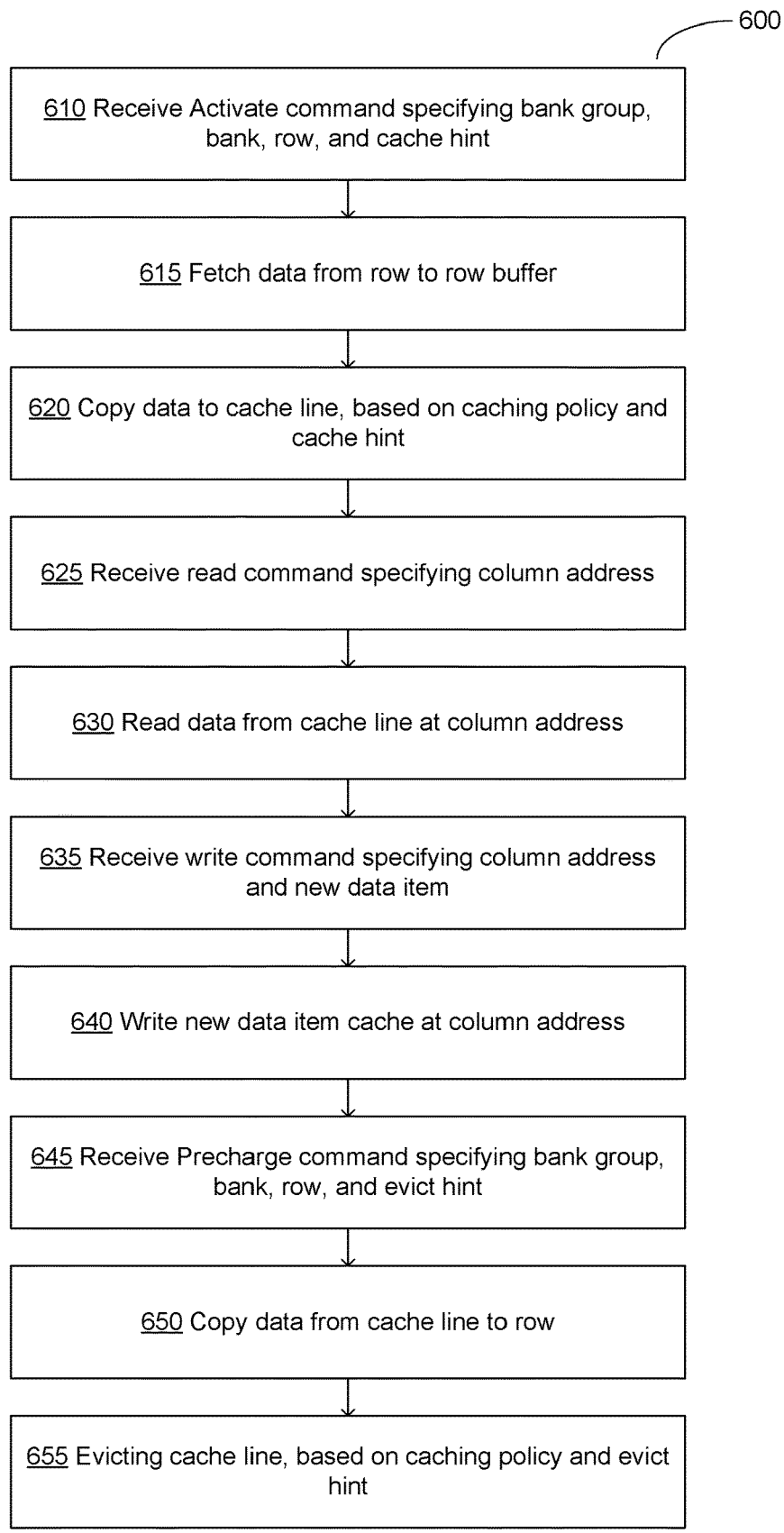
FIG. 6 is a flow diagram of an example method of performing memory access operations by a memory sub-system operating in accordance with embodiments of the present disclosure.

FIG. 6 is a flow diagram of an example method 600 of performing memory access operations by a memory device operating in accordance with embodiments of the present disclosure. As noted herein above, the memory device may include a plurality of memory banks which are grouped in several bank groups. The memory device may further include a plurality of row buffers. In an illustrative example, a subset of row buffers including one or more row buffers may be dedicated to each memory bank. In another illustrative example, a subset of row buffers including two or more row buffers may be shared between several collocated memory banks, or shared between all memory banks of the memory sub-system. The memory device may further include a cache. In some implementations, the size of the cache line may be equal to the row buffer size. In some implementations, the memory device is a dynamic random access memory (DRAM) device, and the cache is a static random access memory (SRAM) device.

As noted herein above, in some embodiments, the memory interface may be enhanced by implementing certain cache-related hints in several commands, thus allowing the host to instruct the memory device to cache or evict certain data. Accordingly, the method 600 may be performed by the memory sub-systems and/or memory devices of FIGS. 2-5. Although the operations of the method are shown in a particular sequence or order, the order of the operations can, unless otherwise specified, be modified. Thus, the illustrated embodiments should be understood only as examples, and the illustrated operations may be performed in a different order, while some operations may be performed in parallel. Additionally, one or more operations may be omitted in some embodiments. Thus, not all illustrated operations are required in every embodiment, and other process flows are possible.

At operation 610, the memory device implementing the method receives an activate command enhanced by a cache hint. Parameters of the Activate command include the bank group address, the bank address, the row address, and the cache hint. Each of the parameters may be encoded by a group of bits transmitted via corresponding inputs of the memory device.

At operation 615, the memory device fetches the data from the row specified by the parameters of the Activate command to a row buffer.

At operation 620, the memory device copies, based on the cache hint and the caching policy associated with the memory device, the data to a cache line, which may be identified by the CAM circuit translating the memory address specified by the parameters of the Activate command. If no cache line has been previously associated with the specified address, an available cache line may be associated with the specified address, and the cache metadata may be updated accordingly. If no cache lines are available, a cache line may be evicted in accordance with the eviction policy implemented by the memory device.

In an illustrative example, if the caching policy implemented by the memory device involves caching all data retrieved from the main memory, processing the Activate command would involve caching the data that has been read from the specified row, unless the "exclude from caching" hint is supplied by the Activate command. Conversely, if the caching policy implemented by the memory device only involves selective caching of the data retrieved from the main memory, processing the Activate command would involve caching the data read from the specified row if the "cache this" hint is supplied by the Activate command.

At operation 625, the memory device receives a read command specifying a column address.

At operation 630, the memory device reads the data from the cache line, at the offset identified by the column address.

At operation 635, the memory device receives a write command specifying a column address and a new data item to be stored on the memory device.

At operation 640, the memory device stores the new data item to the cache line, at the offset identified by the column address.

At operation 645, the memory device receives a pecharge command. Parameters of the precharge command include the bank group address, the bank address, the row address, and the evict hint. Each of the parameters may be encoded by a group of bits transmitted via corresponding inputs of the memory device.

At operation 650, the memory device copies the data from the cache line to the memory bank location specified by the command parameters.

Figure 7:
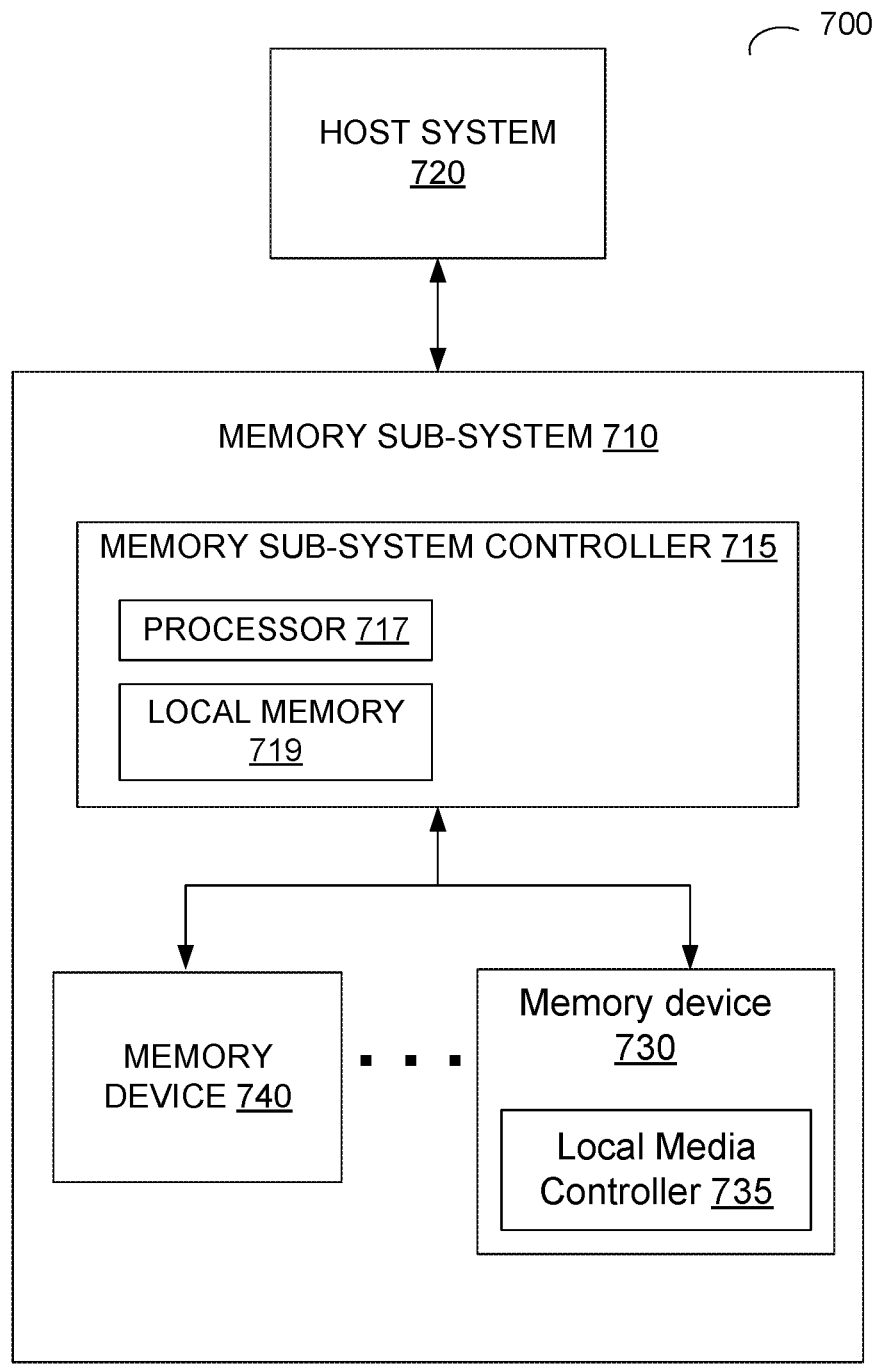
FIG. 7 illustrates an example computing system that includes a memory sub-system implemented in accordance with some embodiments of the present disclosure.

At operation 655, the memory device evicts the cache line based on the cache hint and the caching policy associated with the memory device. In an illustrative example, if the evict hint supplied by the precharge command is set, the cache line is evicted, and the cache metadata may be modified accordingly. Upon completing operation 655, the method terminates FIG. 7 illustrates an example computing system 700 that includes a memory sub-system 710 implemented in accordance with some embodiments of the present disclosure. The memory sub-system 710 may include media, such as one or more volatile memory devices (e.g., memory device 740), one or more non-volatile memory devices (e.g., memory device 730), or a combination of such. In some embodiments, the memory sub-system 710 corresponds to the memory sub-system 100 of FIGS. 1A-1B.

The memory sub-system 710 may be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 700 may be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 700 may include a host system 720 that is coupled to one or more memory sub-systems 710. In some embodiments, the host system 720 is coupled to different types of memory sub-systems 710. FIG. 7 illustrates one example of a host system 720 coupled to one memory sub-system 710. The host system 720 may include a processor chipset and a software stack executed by the processor chipset. The processor chipset may include one or more cores, one or more caches, a memory controller (e.g., NVDIMM controller), and a storage protocol controller (e.g., PCIe controller, SATA controller). The host system 720 uses the memory sub-system 710, for example, to write data to the memory sub-system 710 and read data from the memory sub-system 710.

The host system 720 may be coupled to the memory sub-system 710 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface may be used to transmit data between the host system 720 and the memory sub-system 710. The host system 720 may further utilize an NVM Express (NVMe) interface to access components (e.g., memory devices 730) when the memory sub-system 710 is coupled with the host system 720 by the PCIe interface 105. The physical host interface 105 may provide an interface for passing control, address, data, and other signals between the memory sub-system 710 and the host system 720. FIG. 7 illustrates a memory sub-system 710 as an example. In general, the host system 720 may access multiple memory sub-systems via a same communication connection, multiple separate communication connections, and/or a combination of communication connections.

The memory devices 730, 740 may include any combination of the different types of non-volatile memory devices and/or volatile memory devices. The volatile memory devices (e.g., memory device 740) may be, but are not limited to, random access memory (RAM), such as dynamic random access memory (DRAM) and synchronous dynamic random access memory (SDRAM).

Some examples of non-volatile memory devices (e.g., memory device 730) include negative-and (NAND) type flash memory and write-in-place memory, such as a three-dimensional cross-point ("3D cross-point") memory device, which is a cross-point array of non-volatile memory cells. A cross-point array of non-volatile memory may perform bit storage based on a change of bulk resistance, in conjunction with a stackable cross-gridded data access array. Additionally, in contrast to many flash-based memories, cross-point non-volatile memory may perform a write in-place operation, where a non-volatile memory cell may be programmed without the non-volatile memory cell being previously erased. NAND type flash memory includes, for example, two-dimensional NAND (2D NAND) and three-dimensional NAND (3D NAND).

Each of the memory devices 730 may include one or more arrays of memory cells. One type of memory cell, for example, single level cells (SLC) may store one bit per cell. Other types of memory cells, such as multi-level cells (MLCs), triple level cells (TLCs), and quad-level cells (QLCs), may store multiple bits per cell. In some embodiments, each of the memory devices 730 may include one or more arrays of memory cells such as SLCs, MLCs, TLCs, QLCs, or any combination of such. In some embodiments, a particular memory device may include an SLC portion, and an MLC portion, a TLC portion, or a QLC portion of memory cells. The memory cells of the memory devices 730 may be grouped as pages that may refer to a logical unit of the memory device used to store data. With some types of memory (e.g., NAND), pages may be grouped to form blocks.

Although non-volatile memory devices such as 3D cross-point array of non-volatile memory cells and NAND type memory (e.g., 2D NAND, 3D NAND) are described, the memory device 730 may be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 775 may communicate with the memory devices 730 to perform operations such as reading data, writing data, or erasing data at the memory devices 730 and other such operations. The memory sub-system controller 775 may include hardware such as one or more integrated circuits and/or discrete components, a buffer memory, or a combination thereof. The hardware may include digital circuitry with dedicated (i.e., hard-coded) logic to perform the operations described herein. The memory sub-system controller 775 may be a microcontroller, special purpose logic circuitry (e.g., a field programmable gate array (FPGA), an application specific integrated circuit (ASIC), etc.), or other suitable processor.

The memory sub-system controller 775 may include a processor 717 (e.g., a processing device) configured to execute instructions stored in a local memory 719. In the illustrated example, the local memory 719 of the memory sub-system controller 775 includes an embedded memory configured to store instructions for performing various processes, operations, logic flows, and routines that control operation of the memory sub-system 710, including handling communications between the memory sub-system 710 and the host system 720. In some embodiments, the processor 717 may implement the methods 600-650, as described in more detail herein above.

In some embodiments, the local memory 719 may include memory registers storing memory pointers, fetched data, etc. The local memory 719 may also include read-only memory (ROM) for storing micro-code. While the example memory sub-system 710 in FIG. 7 has been illustrated as including the controller 775, in another embodiment of the present disclosure, a memory sub-system 710 does not include a controller 775, and may instead rely upon external control (e.g., provided by an external host, or by a processor or controller separate from the memory sub-system).

In general, the memory sub-system controller 775 may receive commands or operations from the host system 720 and may convert the commands or operations into instructions or appropriate commands to achieve the desired access to the memory devices 730. The memory sub-system controller 775 may be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 730. The memory sub-system controller 775 may further include host interface circuitry to communicate with the host system 720 via the physical host interface. The host interface circuitry may convert the commands received from the host system into command instructions to access the memory devices 730 as well as convert responses associated with the memory devices 730 into information for the host system 720.

The memory sub-system 710 may also include additional circuitry or components that are not illustrated. In some embodiments, the memory sub-system 710 may include a cache or buffer (e.g., DRAM) and address circuitry (e.g., a row decoder and a column decoder) that may receive an address from the controller 775 and decode the address to access the memory devices 730.

In some embodiments, the memory devices 730 include local media controllers 735 that operate in conjunction with memory sub-system controller 775 to execute operations on one or more memory cells of the memory devices 730. An external controller (e.g., memory sub-system controller 775) may externally manage the memory device 730 (e.g., perform media management operations on the memory device 730). In some embodiments, memory sub-system 710 is a managed memory device, which is a raw memory device 730 having control logic (e.g., local media controller 735) on the die and a controller (e.g., memory sub-system controller 775) for media management within the same memory device package. An example of a managed memory device is a managed NAND (MNAND) device.

Figure 8:
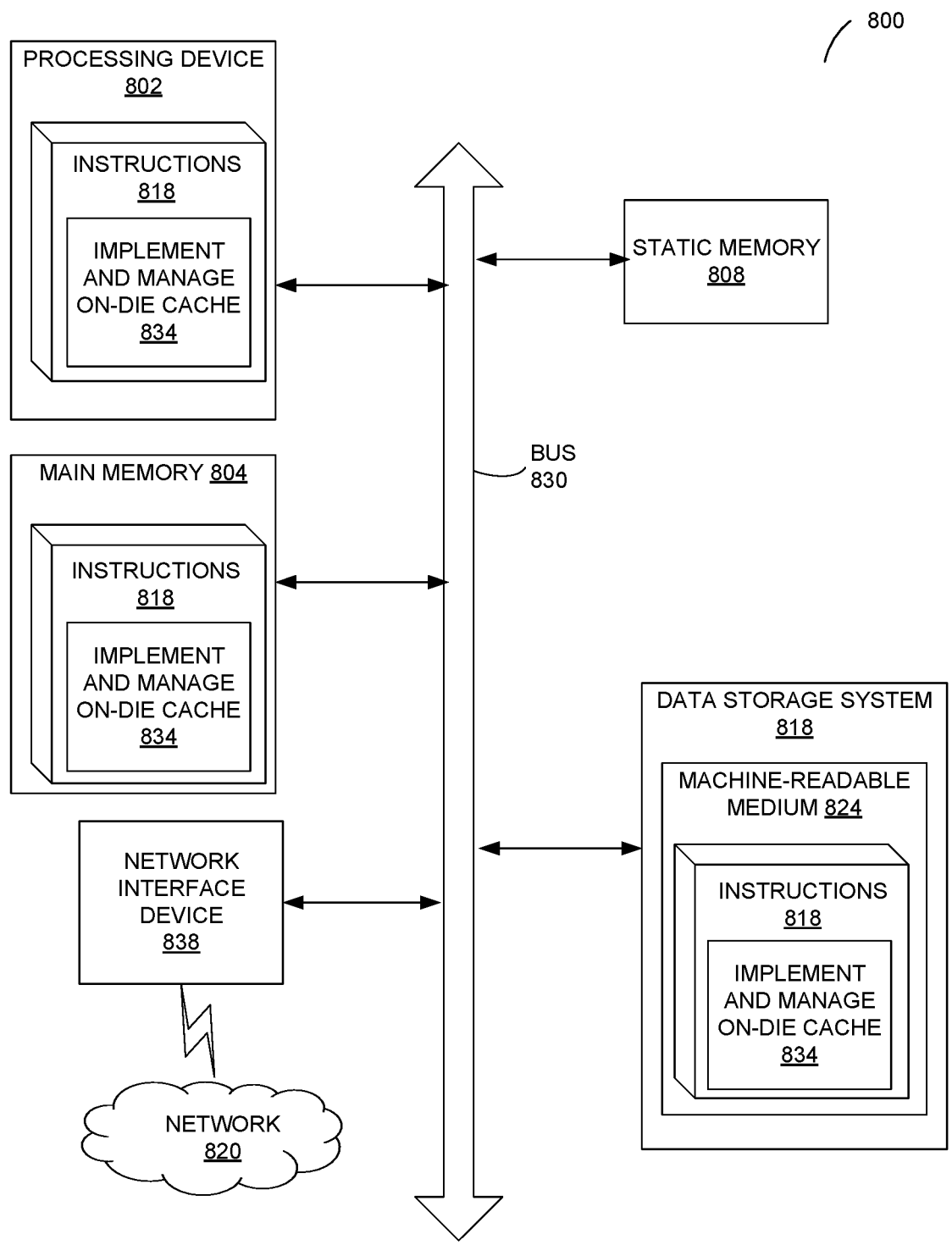
FIG. 8 is a block diagram of an example host computer system in which embodiments of the present disclosure may operate.

FIG. 8 illustrates an example machine of a computer system 800 within which a set of instructions, for causing the machine to perform any one or more of the methods discussed herein, may be executed. In some embodiments, the computer system 800 may correspond to a host system (e.g., the host system 120 of FIG. 7) that includes, is coupled to, or utilizes a memory sub-system (e.g., the memory sub-system 100 of FIGS. 1A-1B or the memory sub-system 710 of FIG. 7).

In alternative embodiments, the machine may be connected (e.g., a network interface device 838 coupled to the network 820) to other computer system in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methods discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 808 (e.g., flash memory, static random access memory (SRAM), etc.), and a data storage system 818, which communicate with each other via a bus 830.

Processing device 802 represents one or more general-purpose processing devices such as a microprocessor, a CPU, or the like. More particularly, the processing device may be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 is configured to execute instructions 828 for performing the methods discussed herein (e.g., managing the on-die cache, as described in more detail herein above).

The data storage system 818 may include a machine-readable storage medium 824 (also known as a computer-readable medium) on which is stored one or more sets of instructions 828 or software embodying any one or more of the methodologies or functions described herein. The instructions 828 may also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 may correspond to the memory sub-system 110 of FIG. 7.

In one embodiment, the instructions 828 include instructions 834 to implement and manage the on-die device cache in accordance with some embodiments of the present disclosure. While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure may refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus may be specially constructed for the intended purposes, or it may include a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the present disclosure have been described with reference to specific example embodiments thereof. It will be evident that various modifications may be made thereto without departing from the broader spirit and scope of embodiments of the present disclosure as set forth in the following claims. The specification and drawings are, accordingly, to be regarded in an illustrative sense rather than a restrictive sense.

What is claimed is:

1. A memory device, comprising:
   a plurality of bank groups, wherein each bank group comprises a plurality of memory banks;
   a plurality of row buffers, wherein at least one row buffer of the plurality of row buffers is associated with each memory bank of the plurality of memory banks;
   a cache comprising a plurality of cache lines, wherein a size of each cache line of the plurality of cache lines is equal to a size of a first row buffer of the plurality of row buffers;
   a processing logic communicatively coupled to the plurality of bank groups and the plurality of row buffers, the processing logic to perform operations comprising:
      receiving an activate command comprising a cache hint and an identifier of a row of a memory bank of the plurality of memory banks, wherein the cache hint is encoded by one or more bits and instructs the memory device to cache a content of the identified row;
      fetching data from the row identified by the activate command to a second row buffer of the plurality of row buffers; and
      copying, based on the cache hint and a caching policy specifying selective data caching, the data to a cache line of the plurality of cache lines.

2. The memory device of claim 1, wherein the memory device is a dynamic random access memory (DRAM) device.

3. The memory device of claim 1, wherein the cache is a static random access memory (SRAM) device.

4. The memory device of claim 1, wherein the processing logic comprises a content-addressable memory (CAM) circuit to translate a memory address to one of: an identifier of a particular row of a particular memory bank of the plurality of memory banks or an identifier of a particular line of the cache.

5. The memory device of claim 1, wherein the processing logic is to further perform operations comprising:
   receiving a read command specifying a column address;
   reading at least a part of the data from a location of the cache line, wherein the location is identified by the column address.

6. The memory device of claim 1, wherein the processing logic is to further perform operations comprising:
receiving a write command specifying a column address and new data;
storing the new data to a location of the cache line, wherein the location is identified by the column address.

7. The memory device of claim 1, wherein the processing logic is to further perform operations comprising:
receiving a precharge command specifying the row of the memory bank;
copying the data from the cache line to the row of the memory bank.

8. A system, comprising:
a plurality of bank groups, wherein each bank group comprises a plurality of memory banks;
a plurality of row buffers communicatively coupled to the plurality of bank groups;
a cache comprising a plurality of cache lines, wherein a size of each cache line of the plurality of cache lines is equal to a size of a row buffer of the plurality of row buffers;
a content-addressable memory (CAM) circuit to translate a specified memory address to one of: an identifier of a particular row of a particular memory bank of the plurality of memory banks or an identifier of a particular line of the cache;
a processing logic communicatively coupled to the plurality of bank groups and the plurality of row buffers, the processing logic to perform operations comprising:
receiving a read command specifying a memory address comprising a cache selector bit at a specified position within the memory address, wherein a first value of the cache selector bit indicates that the memory address references a memory location and a second value of the cache selector bit indicates that the memory address references a cache location;
translating, by the CAM circuit, based on the cache selector bit, the memory address to an identifier of a cache line of the plurality of cache lines; and
reading data from the cache line.

9. The system of claim 8, wherein each memory bank of the plurality of memory banks is a dynamic random access memory (DRAM) bank.

10. The system of claim 8, wherein the cache is a static random access memory (SRAM) device.

11. The system of claim 8, wherein one or more row buffers of the plurality of row buffers are associated with each memory bank of the plurality of memory banks.

12. The system of claim 8, wherein the processing logic is to further perform operations comprising:
receiving a write command specifying the memory address and new data;
translating, by the CAM circuit, the memory address to the identifier of the cache line of the plurality of cache lines; and
storing the new data to the cache line.

13. The system of claim 8, wherein the processing logic is to further perform operations comprising:
receiving a precharge command specifying the row of the memory bank;
copying the data from the cache line to the row of the memory bank.

14. A method, comprising:
receiving, by a memory device, an activate command comprising a cache hint and an identifier of a row of a memory bank of a plurality of memory banks of the memory device, wherein the cache hint is encoded by one or more bits and instructs the memory device to cache a content of the identified row;
fetching data from the row identified by the activate command to a row buffer of a plurality of row buffers of the memory device;
copying, based on the cache hint and a caching policy specifying selective data caching, the data to a cache line of a plurality of cache lines of the memory device, wherein a size of each cache line of the plurality of cache lines is equal to a size of a row buffer of the plurality of row buffers.

15. The method of claim 14, wherein the memory device is a dynamic random access memory (DRAM) device.

16. The method of claim 14, wherein the plurality of cache lines reside on a static random access memory (SRAM) device.

17. The method of claim 14, further comprising:
translating, by a content-addressable memory (CAM) circuit, an identifier of the memory bank and identifier of the row to an identifier of the cache line.

18. The method of claim 14, further comprising:
receiving a read command specifying a column address;
reading at least a part of the data from a location of the cache line, wherein the location is identified by the column address.

19. The method of claim 14, further comprising:
receiving a write command specifying a column address and new data;
storing the new data to a location of the cache line, wherein the location is identified by the column address.

20. The method of claim 14, further comprising:
receiving a precharge command specifying the row of the memory bank and an evict hint;
responsive to determining that the evict hint is set to a first value, evicting the cache line; and
copying the data from the cache line to the row of the memory bank.

* * * * *